United States Patent [19]

Narizuka et al.

[11] Patent Number: 4,806,725
[45] Date of Patent: Feb. 21, 1989

[54] CIRCUIT SUBSTRATE AND THERMAL PRINTING HEAD USING THE SAME

[75] Inventors: Yasunori Narizuka, Yokohama; Keiji Mori, Yamato; Akira Yabushita, Yokohama; Tsuneaki Kamei, Kanagawa; Mamoru Morita, Hiratsuka, all of Japan

[73] Assignee: Hitachi, Ltd., Tokyo, Japan

[21] Appl. No.: 71,325

[22] Filed: Jul. 9, 1987

[30] Foreign Application Priority Data

Jul. 11, 1986 [JP] Japan .................... 61-161823
Jul. 23, 1986 [JP] Japan .................... 61-171537

[51] Int. Cl.[4] .............................. H05B 1/00
[52] U.S. Cl. ..................... 219/216; 338/307; 420/457
[58] Field of Search ........... 219/216; 338/307, 309; 420/457; 346/76 PH; 174/68 A, 102 A; 361/397, 400, 411; 357/65, 67; 428/618

[56] References Cited

U.S. PATENT DOCUMENTS

| | | | |
|---|---|---|---|
| 2,090,946 | 8/1937 | Kurtz et al. | 420/457 |
| 2,150,094 | 3/1939 | Bieber | 420/457 X |
| 2,234,955 | 3/1941 | Bieber et al. | 420/457 X |
| 3,282,689 | 11/1966 | Santner | 420/457 X |
| 4,195,937 | 4/1980 | Baran | 346/76 PH X |

OTHER PUBLICATIONS

Sharp Ghio Technical Bulletin, No. 33, pp. 55-60; 1985.

Primary Examiner—H. Broome
Assistant Examiner—Marvin M. Lateef
Attorney, Agent, or Firm—Antonelli, Terry & Wands

[57] ABSTRACT

A circuit substrate, such as a thermal printing head, having electrodes made of a material suitable for soldering. The electrode to be soldered, at least in part, is composed of an alloy of Ni and Cu, whose composition ranges from 65 mol % Ni - 35 mol % Cu to 75 mol % Ni - 25 mol % Cu.

10 Claims, 5 Drawing Sheets

F I G. 1
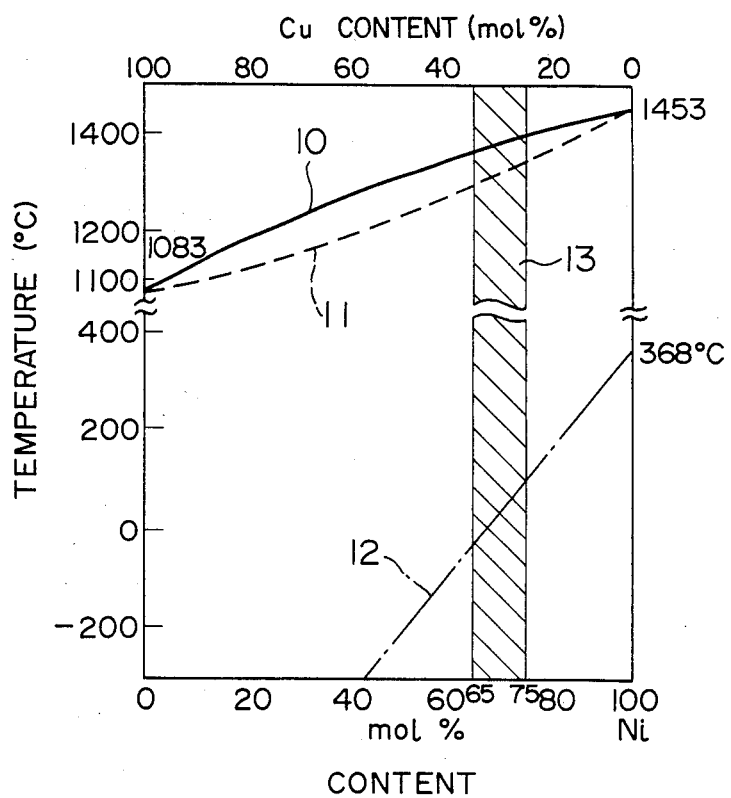

F I G. 2
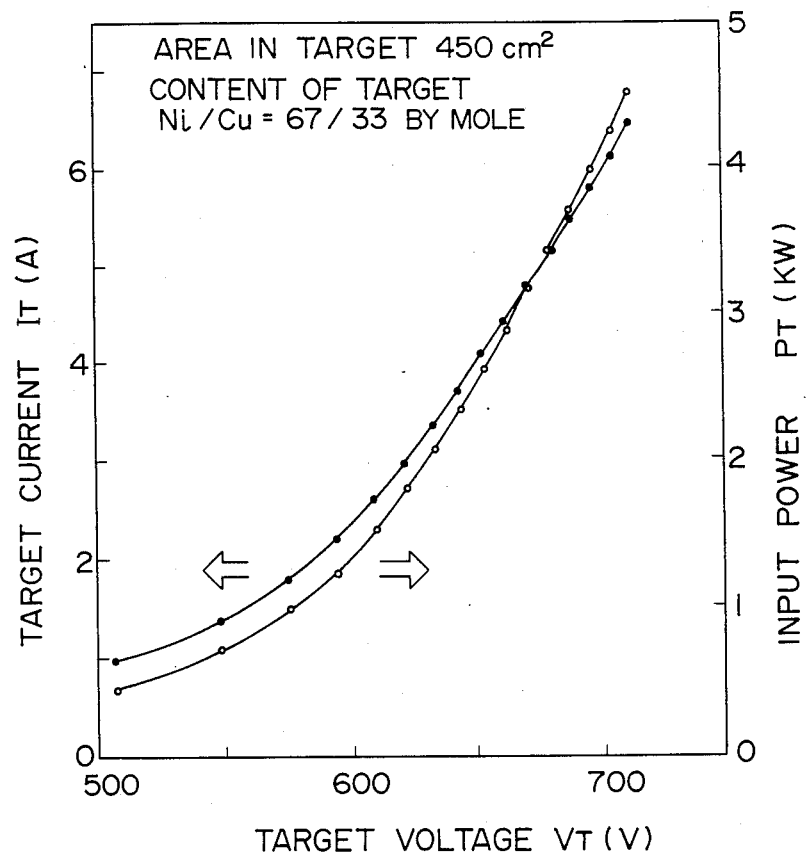

CIRCUIT SUBSTRATE AND THERMAL PRINTING HEAD USING THE SAME

BACKGROUND OF THE INVENTION

This invention relates to a circuit substrate and a thermal printing head using the circuit substrate, and more particularly to a circuit substrate provided with fine electrodes suitable for soldering, that is, the so called "microsoldering" and a thermal printing head using the said circuit substrate.

The conventional electrodes for solder bonding, provided on a circuit substrate, are formed by laying an adhesive layer 2 (mainly of chromium) and a barrier metal layer 3 (for example, of Cu, Cu+Cr, Ni, Pd, Al or Rh) successively on a circuit layer 1, as shown in FIG. 5, and, if desired, by further laying an oxidation protective film of Au, etc. thereon, where numeral 4 is a solder. The thickness of electrodes and the adhesion of the solder depend upon the properties of a barrier metal.

For example, Cu is dissolved from the Cu barrier into the molten solder in an amount corresponding to about 1 to a few $\mu m$ of the Cu barrier layer thickness by only one run of soldering, and thus it is at least necessary that the Cu barrier layer has a larger thickness than the corresponding dissolved Cu layer thickness, and, when solder bonding operation is once more carried out, melting of the solder is to be carried out in a total of two runs, for example, when the initial solder bonding is removed and when second bonding by solder is carried out, Cu is to be dissolved from the Cu barrier layer into the molten solder in a double amount, and thus, the actually necessary thickness of the barrier metal layer is 3 to 4 times the corresponding dissolved layer thickness by one run of soldering, and in the case of Cu barrier metal, the necessary layer thickness will be at least 3-4 $\mu m$.

When such a thick barrier metal layer is formed on a substrate, breakage of the substrate or cracking of the barrier metal layer itself is liable to occur owing to a thermal stress due to a difference in the coefficient of thermal expansion. Furthermore, when an electrode-protective layer is formed on the electrodes, some defects are liable to occur owing to a level difference between the substrate and the electrodes. In the case of other barrier metals than Cu, the necessary thickness of such barrier metal layer is smaller than that of the Cu barrier-layer, but a bonding failure often occurs owing to the poor adhesion to the solder. Furthermore, Pd and Rh are very expensive as barrier metals.

To solve these problems, Sharp Giho (Technical Bulletin), No. 33, pages 55-60 (1985) discloses use of a Cu—Ni alloy, as shown in FIG. 6(a), where the Cu13 Ni alloy layer is formed to a thickness of 1 $\mu m$ as a circuit and barrier metal layer 6, whereby the layer can withstand two reruns of bonding (that is, three runs of soldering). In FIG. 6(a), numeral 1 is an aluminum thin film, 2 a lower circuit layer, 5 a substrate, 6 an upper circuit layer, 7 a polyamide-imide resin layer, 8 a silicone protective layer and 9 is a gold layer. The Cu—Ni alloy barrier layer having a layer thickness of 0.3 to 0.5 $\mu m$ cannot withstand 3-4 runs of soldering in contrast to the Rh or Pd barrier layer.

Furthermore, in this case, a resin is used as a protective layer 8 for the barrier Cu—Ni alloy layer, but no mention is made of the adhesion of the barrier layer to a protective layer of inorganic materials such as $SiO_2$, $Ta_2O_5$, etc.

The present inventors have studied Cu—Ni alloy barrier layers having various compositions and investigated the problems of the prior art, and have found that a solder-diffusion prevention can be obtained by forming an alloy barrier layer having a composition of 50 mol. % Ni—50 mol. % Cu on the substrate. However, it has been found that there still are the following problems. That is, the Cu—Ni alloy barrier layer thus formed has a very poor adhesion to the protective layer of $SiO_2$ formed on the barrier layer by RF sputtering, and the protective layer is easily peeled off from the barrier layer by heating or cooling or the barrier Cu—Ni alloy barrier layer has a poor anticorrosivity to a resist-removing agent to be used during the photo-etching, and consequently is easily corroded in the circuit pattern-forming process.

In other words, the prior art disclosed in the said Sharp Giho fails to take into account any application of the barrier metal layer to a fine circuit, and it is impossible to form electrodes having a width of a few ten $\mu m$, as required for IC terminals to be soldered, etc., or to form a protective layer of inorganic material such as $SiO_2$, etc. on the barrier metal layer. Furthermore, the disclosed prior art is directed only to circuits requiring a film thickness of about 1 $\mu m$, and thus cannot be applied to IC terminals to be soldered, a thermal printing head, etc., particularly to CCB bonding, owing to the insufficient properties as required for a solder-diffusion protective layer.

SUMMARY OF THE INVENTION

An object of the present invention is to provide an electrode material to be soldered, which has a sufficiently high solder-diffusion prevention, a good adhesion to an inorganic material and a low production cost, thereby attaining a broader range of application of the technique of soldering a fine circuit.

This object can be attained by making the entire electrode or such parts of the electrode that is desired to be protected from diffusion of solder component metals such as Sn, Pb, In, etc. from a metal having a good adhesion to the molten solder and a low diffusion rate for the solder component metal, that is, a high capability to retard the diffusion of the solder component metals.

The diffusion coefficient and the activation energy required for the diffusion between the solder component metals and the electrode component metals are shown in Table 1.

TABLE 1

| Electrode component metal | Solder component metal | | | |
|---|---|---|---|---|
| | Sn | Pb | In | Ag |
| Al | $3.1 \times 10^{-11}$  845  673 ~ 903 | $5.0 \times 10^{-3}$  146  777 ~ 876 | $1.16 \times 10^{-4}$  123  715 ~ 925 | $1.18 \times 10^{-5}$  116  644 ~ 928 |
| Cu | $1.1 \times 10^{-5}$  188  953 ~ 1183 | $8.62 \times 10^{-5}$  182  1007 ~ 1225 | $1.3 \times 10^{-4}$  193  1043 ~ 1343 | $6.1 \times 10^{-5}$  195  728 ~ 1337 |
| Au | $4.1 \times 10^{-6}$  143  973 ~ 1273 | — — | $75 \times 10^{-6}$  154  973 ~ 1273 | $7.2 \times 10^{-6}$  168  972 ~ 1281 |

TABLE 1-continued

| Electrode component metal | Solder component metal | | | |
|---|---|---|---|---|
| | Sn | Pb | In | Ag |
| Fe | $3.5 \times 10^{-7}$ 191<br>1325 ~ 1580 | $4.0 \times 10^{-5}$ 279<br>1373 ~ 1523 | — | $2.2 \times 10^{-3}$ 258<br>1101 ~ 1174 |
| Ni | $3.0 \times 10^{-3}$ 274<br>1546 ~ 1756 | — | — | $1.04 \times 10^{-2}$ 292<br>1053 ~ 1326 |
| Ag | $2.5 \times 10^{-5}$ 164<br>865 ~ 1210 | $2.2 \times 10^{-5}$ 159<br>973 ~ 1098 | $4.1 \times 10^{-5}$ 170<br>885 ~ 1210 | $6.7 \times 10^{-5}$ 189<br>913 ~ 1228 |

Figures in each unit frame show the following items:

| Diffusion coefficient ($m^2/S$) | Activation energy (KJ/md) |
|---|---|
| Measurement temperature (°K.) | |

As the electrode metal, Al, Cu and Ni are preferably used from the viewpoint of physical properties as shown in Table 1 and the properties of oxide layer as well as costs. However, these electrode metals still have problems. For example, Al forms a rigid oxide layer within a short time, and thus has a poor adhesion to a solder. Cu readily undergoes oxidation and thus its heat treatment must be carefully carried out. Furthermore, Cu has a high diffusion rate for solder component metals and thus the Cu electrode must have a larger thickness. Ni has a low diffusion rate for solder component metals, but has a low adhesion to a solder, and thus the soldering conditions are often limited. Thus, an electrode terminal material most suitable for the soldering conditions must be selected, but no such a simple metal that can satisfy both adhesion to a solder and solder-diffusion protection has been found yet. That is, the said Cu—Ni alloy barrier layer has been proposed to satisfy the said requirements, but is not satisfactory with respect to the solder diffusion protection, etc., as described above.

The present inventors have successfully solved the problems of the Cu—Ni alloy barrier layer by optimizing the composition of Cu—Ni alloy.

FIG. 1 shows an equilibrium phase diagram of Cu—Ni binary alloy equilibrium phase diagram, from which it is seen that the alloy is an all proportional solid solute and no formation of brittle intermediate phase is observable at all. That is, the alloy having any composition can be formed easily. Better solder-diffusion protection can be obtained with a higher Ni content, and thus as high Ni content as possible is desirable, but in the case of high speed film formation by magnetron sputtering, the alloy must be non-magnetic. Thus, a composition around 70 mol % Ni—30 mol % Cu having a Curie point of about 0° C. is found to be most preferable. The alloy of such a composition has a high Ni content, and thus will be hereinafter referred to as "Ni—Cu alloy".

A film that can withstand three runs of soldering even with a thickness of 0.5 μm and can have an equivalent solder-diffusion protection to that of Ni or such noble metals as Rh, etc. can be formed from Ni-Cu alloys having a high Ni content, particularly from compositions around 70 mol % Ni—30 mol % by high speed, high film thickness precision magnetron sputtering. The thus formed film has better adhesion to an inorganic material and a higher anticorrosivity during the photo-etching than the conventional Cu—Ni alloy barrier layer, and thus can be used as a low cost material for a thermal printing head or for bonding IC, etc.

BRIEF DESCRIPTION OF THE DRAWINGS

FIG. 1 is a Cu—Ni binary alloy equilibrium phase diagram showing Ni—Cu alloy composition range according to the present invention.

FIG. 2 is a diagram showing conditions for forming a Ni—Cu alloy film according to one embodiment of the present invention.

DETAILED DESCRIPTION OF THE PREFERRED EMBODIMENTS

Figure 3:
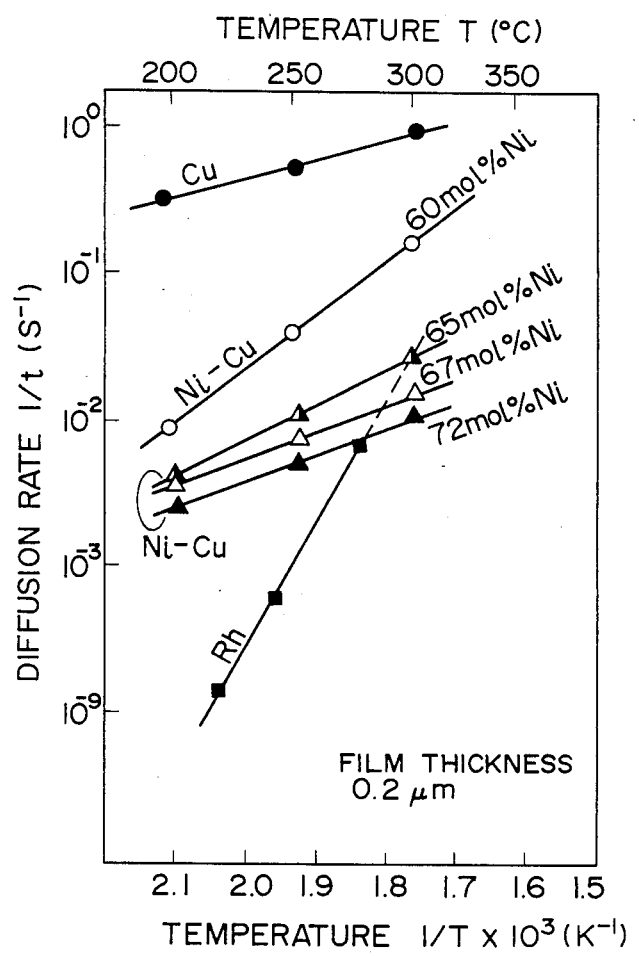
FIG. 3 is a diagram showing solder-diffusion rates of the solder-diffusion protective metals or metal alloys.

The present invention will be described in detail, referring to Examples by way of the accompanying drawings.

EXAMPLE 1

Actual electrodes can be formed from Ni—Cu alloy according to the following processes.

(1) Melt Plating Process

A substrate is dipped in a molten Ni—Cu alloy. Application of the melt plating process is limited by the thickness of a Ni—Cu film and heat resistance of the substrate.

(2) Melt Injection Process

A molten Ni—Cu alloy is sprayed onto a substrate. Application of the melt injection process is considerably limited by the heat resistance of a substrate and the thickness of a Ni—Cu film.

(3) Gas phase Plating Process

Vapor deposition and sputtering are typical of gas phase plating process, and a Ni—Cu film can be uniformly formed on a substrate at low substrate temperature.

Among these three processes, the gas phase plating process is most promising. Thus, in this Example a Ni—Cu film was formed according to the gas phase plating process. As a means for uniformly forming a thin film, sputtering is preferable but it is said that sputtering of an alloy generally gives a large fluctuation to the composition.

The present inventors studied causes for the large fluctuation in the composition, and found that an alloy film could be stably formed by sputtering while thoroughly cooling a target for use in the sputtering. On the basis of this finding, the present inventors prepared a target of Ni—Cu alloy and formed a Ni—Cu film on a substrate by magnetron sputtering. Electric discharge characteristics and the results of composition analysis of formed films by the magnetron sputtering are shown in FIG. 2 and the following Table 2.

TABLE 2

| Deposited sample film No. | Ni mol % | Cu mol % | Total mol % |
|---|---|---|---|
| 1 | 67.0 | 32.4 | 99.4 |
| 2 | 67.7 | 33.2 | 100.9 |
| 3 | 66.9 | 32.5 | 99.4 |
| 4 | 67.5 | 32.9 | 100.4 |

As is obvious from the results of FIG. 2 and Table 2, the composition of the target can be reproduced as such in the Ni—Cu sample films on the substrate, and thus Ni—Cu alloy films can be formed by magnetron sputtering.

The Ni—Cu alloy sample films formed in this Example had a specific resistance of 40 to 50 $\mu\Omega\cdot$cm, which was substantially on the same level as that of the intermetallic compound of Sn and Cu formed by bonding a Cu electrode with a solder. Thus, it seems that an increase in the resistance at the solder-bonded part is substantially on the same level as so far experienced.

The conditions for forming the sample films shown in Table 2 are as follows:
Analysis: by electron probe microanalysis (EPMA)
Conditions:
  Acceleration voltage: 25 kV
  Sample current: 10 nA
  Beam diameter: 100 $\mu$m
  Monochromator crystal: LiF
Alloy target composition: 67 mol % Ni—33 mol % Cu

EXAMPLE 2

It was found in Example 1 that Ni—Cu alloy films could be formed by magnetron sputtering, and thus in this example, Ni—Cu alloy films having the following compositions were formed and their solder-diffusion protections were investigated.

(1) 60 mol % Ni—40 mol % Cu
(2) 65 mol % Ni—35 mol % Cu
(3) 67 mol % Ni—33 mol % Cu
(4) 72 mol % Ni—28 mol % Cu
(5) 75 mol % Ni—25 mol % Cu
(6) 77 mol % Ni—23 mol % Cu FIG. 3 shows the solder-diffusion protections of the thus formed Ni—Cu alloy films by way of diffusion rates for a solder against the temperature, where the diffusion rates for a solder were determined by measuring the time required for passing a 63 mol % Sn—37 mol % Pb solder having a high diffusion rate through the various metal films having a thickness of 0.2 $\mu$m. As is obvious from FIG. 3, the larger the Ni content of Ni—Cu alloy film, the smaller the diffusion rate for the solder. The 65 mol % Ni—35 mol % Cu alloy film was equivalent to the Rh film in the diffusion rate for the solder. Among the metal films (1) to (6) as mentioned above, glow discharge by magnetron sputtering was quite hard to take place in the case of (4) 75 mol % Ni—25 mol % Cu alloy film, and no glow discharge by magnetron sputtering occurred in the case of (5) 77 mol % Ni—23 mol % Cu alloy. Thus, the diffusion rate of these two alloy films could not be determined. Thus, it was found that the composition of 75 mol % Ni—25 mol % Cu was a limit to formation of a film by magnetron sputtering using an ordinary ferrite magnet. That is, with this composition, a ferromagnetism appeared at room temperature. With a rare earth magnet, even a ferromagnetic alloy having a higher Ni content than 75 mol % could undergo magnetron sputtering, but it is well known that the utilization efficiency of a target (Ni—Cu alloy plate according to the present invention) is considerably lowered owing to much localized glow discharge. From the foregoing facts, it was found that the optimum Ni content of Ni—Cu alloy was in a range of from 65 mol % Ni to 75 mol % Ni, as shown in FIG. 1.

EXAMPLE 3

In this example, application of the present invention to a thermal printing head will be shown.

Figure 4A:
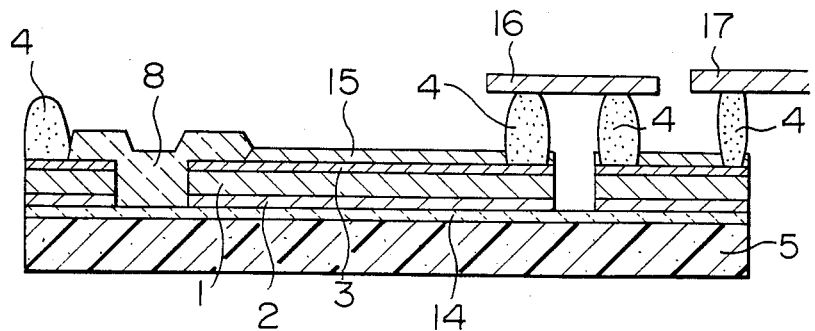
FIG. 4(a) and (b) are cross-sectional views of the structures of thermal printing heads according to embodiments of the present invention.

As shown in FIG. 4(a), an exothermic resistor layer 14, a bonding and electroconductive electrode 2, a circuit layer 1, a barrier metal layer 3 and a solder adhesion-protecting layer 15 are successively formed as films on a substrate 5 by vapor deposition, sputtering or plating.

The following description will be made, referring to formation by sputtering.

A resistor layer of Cr—Si—O system is formed as the exothermic resistor layer 14, and a Cr layer is formed to a thickness of 1.000 Å thereon as the bonding and electroconductive metal layer 2. Furthermore, a Cu layer is formed to a thickness of 0.5 to 2 $\mu$m thereon as the circuit layer 1. A 72 mol % Ni—28 mol % Cu alloy layer of the present invention is formed to a thickness of 0.3 to 0.5 $\mu$m thereon as a barrier metal layer 3. Then, a Cr layer is formed to a thickness of 50 to 500 Å thereon as the solder-adhesion protecting layer 15. Then, patterns are formed by successively photo-etching the layers from the outermost layer inwardly.

The solder adhesion-protecting layer 15, the circuit layer 1, the bonding and electroconductive electrode 2 and the exothermic resistor layer 14 are photo-etched according to the prior art, whereas it has been found that the barrier metal layer 3 of Ni—Cu of the present invention can be etched with any of an aqueous solution of ferric chloride, an aqueous solution of copper chloride, an aqueous solution of ammonium persulfate, and an aqueous solution of iodine and ammonium iodide. These etching solutions can also dissolve the Cu circuit layer 1, and thus actually can continuously dissolve the two layers, that is, the barrier metal layer of Ni—Cu alloy and the Cu circuit layer by one run of etching. This is an advantage of the present invention.

After formation of the exothermic resistor pattern, the circuit pattern, and the solder bonding electrode pattern in this manner, a protective SiO$_2$ layer 8 is formed on the exposed exothermic resistor layer 14 by mask vapor deposition or mask sputtering according to the prior art.

If necessary, a solder 4 is supplied to the parts to be soldered in advance or a solder is formed on the Ni—Cu alloy layer by dipping into a solder bath. However, this procedure is not required, if an article to be bonded by soldering has an enough amount of a solder by itself in advance. Finally, a driver-IC 16 and an external connection electrode 17 is bonded to the barrier metal layer 3 by soldering, whereby the thermal printing head is completed.

The driver-IC as shown in this Example contains 0.1 to 0.3% of deteriorated chips owing to the present level of IC production technology, and in the case of loading a few tens of chips as in a thermal printing head, about one deteriorated chip will be provided in a few thermal printing heads, resulting in production of poor thermal heads with a considerably high probability. Thus, a solder-bonding metal structure capable of exchanging chips is required. To this end the barrier Cu metal layer is as thick as 3–4 μm according to the prior art, whereas in this Example the thickness of the barrier Ni—Cu alloy layer is 0.5 μm, i.e. about one-tenth of that of the Cu metal layer. No problem occurs when the chips are exchanged twice. The barrier Ni—Cu alloy layer has a specific resistance of 40–50 μΩ·cm, which is equal to that of an intermetallic compound of Sn and Cu, formed when the barrier Cu metal layer of the prior art is bonded by a solder, and thus an increase in the resistance at the bonded parts is equal to that of the prior art.

The adhesion of the barrier Ni—Cu alloy layer surface to a solder can be assured, by dipping the alloy layer in a dilute sulfuric acid solution at a few % concentration before soldering, thereby removing a thin film of Ni oxide from the barrier alloy surface. When the soldering is carried out right after the said pretreatment, no poor adhesion problem occurs, but when the pretreated alloy surface is left standing as such, a thin Ni oxide film is again formed on the surface to be soldered. In the latter case, the surface to be soldered is coated with Au by using a commercially available gold exchange plating solution which can deposit Au onto the surface through exchange reaction with Ni, whereby a permanent adhesion to the solder can be assured.

The solder-bonded part has an average breaking strength of 5.2 kg/mm² in the case of soldering the barrier alloy layer having a composition of 72 mol -% 28 mol % Cu with a solder having a composition of 63 mol % Sn—37 mol % Pb, and breaking occurs only at the bonded parts. The breaking strength is at least 1.3 times that of the barrier Cu metal layer of the prior art.

EXAMPLE 4

Figure 4B:
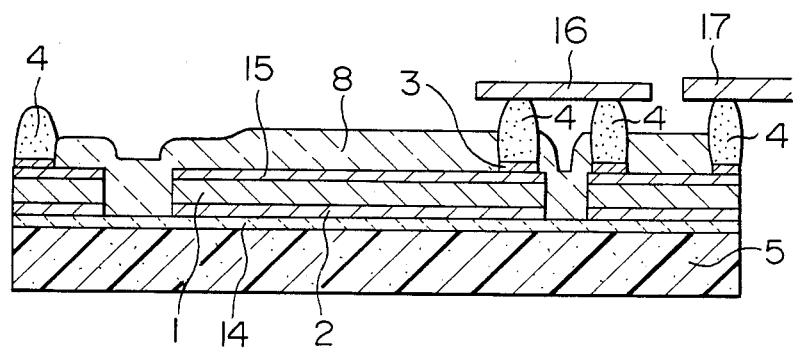
Figure 5:
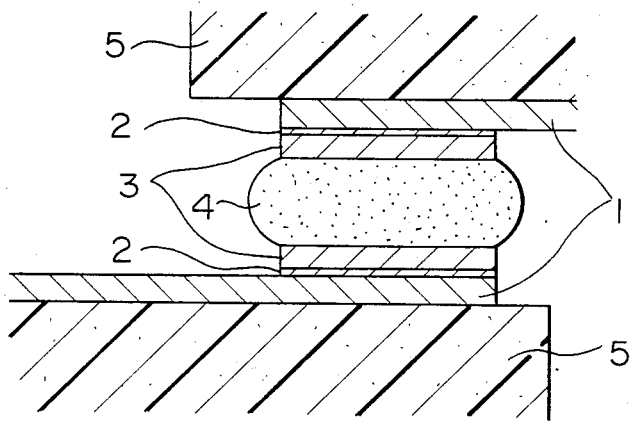
FIG. 5 is a cross-sectional view of a conventional electrode to be soldered.
Figure 6A:
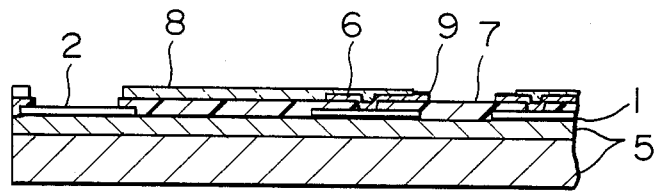
FIG. 6(a) is a cross-sectional view of a substrate provided with an electrode of the conventional Cu—Ni alloy to be soldered.
Figure 6B:
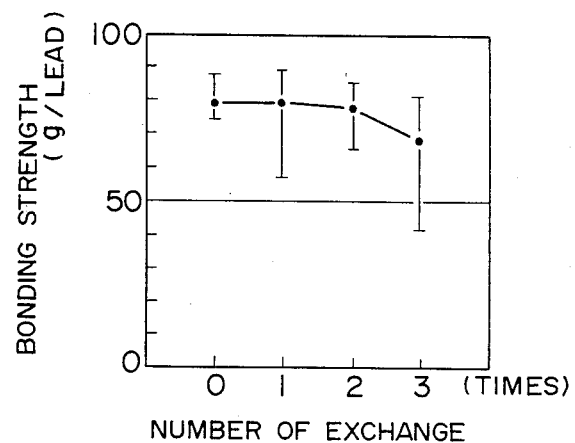
FIG. 6(b) is a diagram showing changes in the strength of the Cu—Ni alloy used in FIG. 6(a) at the bonded part when repeatedly soldered.

As shown in FIG. 4(b), an exothermic resistor layer 14, a bonding and electroconductive electrode 2, a circuit layer 1, a solder adhesion-protecting layer 15 and a barrier metal layer 3 are successively formed as films on a substrate by vapor deposition, sputtering or plating.

The following description will be made, referring to formation by sputtering.

A resistor layer of Cr—Si—O system is formed as the exothermic resistor layer 14, and a Cr layer is formed to a thickness of 1,000 Å thereon as the bonding and electroconductive metal layer 2. Furthermore, a Cu layer is formed to a thickness of 0.2 to 2 μm thereon as the circuit layer 1. A Cr layer is formed to a thickness of 50 to 500 Å thereon as the solder adhesion-protecting layer 15, and a 72 mol % Ni—28 mol % Cu alloy layer of the present invention is formed to a thickness of 0.3 to 0.5 μm thereon as a barrier metal layer 3. Then, patterns are formed by successively photo-etching the layers from the outermost layer inwardly, as in Example 3.

After formation of the exothermic resistor pattern, the circuit pattern, the solder adhesion-protecting layer pattern and the solder bonding electrode pattern in this manner, a protective SiO₂ layer 8 is formed on the exposed exothermic resistor layer 14 by mask vapor deposition or mask sputtering according to the prior art.

In this Example, the barrier Ni—Cu alloy layer is only at the parts to be bonded by a solder, and the parts surrounding the barrier Ni—Cu alloy parts are coated with the solder adhesion protecting metal 15. Thus, no suck structure as to prevent the extension of a solder in the horizontal direction is required on the solder-bonding metal surface. Furthermore, there is the following further advantage of heat treatment. When the Ni-Cu alloy is heated in contact with Cu, for example, at 300° to 400° C. for a few hours, Ni in the Ni—Cu alloy and Cu undergo mutual diffusion, thereby increasing the circuit resistance of Cu, whereas in this Example, Cr is provided therebetween, and thus the mutual diffusion is prevented and the circuit resistance is not influenced by the heating. Thus, a remarkable effect can be obtained when Cu is used as a circuit layer, and this effect can be attained if the Cr layer has a thickness of at least 50 Å.

In Examples 3 and 4, the thickness of the electrode to be soldered is in an order of one-half to one-several tenths of that of the prior art electrode, and thus soldering of fine circuit, for example, the thermal printing head can be readily carried out, reducing the production cost. Furthermore, the present electrode material has a higher solder bonding strength and a higher solder adhesion than those of the prior art electrode material, enhancing the reliability of the solder-bonded parts.

These effects are remarkable when the barrier Ni—Cu alloy layer has a composition ranging from 65 mol % Ni—35 mol % Cu to 25 mol % Ni to 75 mol % Cu, and in this composition range a better solder adhesion can be obtained with a higher Cu content, and a diffusion for solder components takes place more slowly with a higher Ni content. In this composition range, the barrier Ni—Cu alloy layer also has a good adhesion to inorganic materials such as SiO₂, etc., and a good anticorrosivity in the photoetching step and thus can be applied to many kinds of electrical appliances such as IC, thermal printing head, etc.

What is claimed is:

1. A circuit substrate having an electrical circuit, which comprises at least a part of an electrode to be soldered being composed of an alloy of Ni and Cu, whose composition ranges from 65 mol % Ni—35 mol % Cu to 75 mol % Ni—25 mol % Cu so that diffusion of solder into said electrode can be substantially avoided while a protective inorganic material layer, and the solder, have sufficient adhesion to the electrode to be soldered.

2. A thermal printing head having an electrical circuit, which comprises a part to be soldered being composed of an alloy of Ni and Cu, whose composition ranges from 65 mol % Ni—35 mol % Cu to 75 mol % Ni—25 mole % Cu so that diffusion of solder into said part can be substantially avoided while a protective inorganic material layer, and the solder, have sufficient adhesion to the part to be soldered.

3. A circuit substrate comprising an electrical circuit having an electrode electrically connected to the electrical circuit, and a solder in electrical contact with the electrode, the electrode constituting a barrier metal layer between the solder and the electrical circuit, and a protective inorganic material layer in contact with the electrode, the electrode, at least in part, being composed of an alloy of Ni and Cu, whose composition ranges from 65 mol % Ni—35 mol % Cu to 75 mol % Ni—25 mol % Cu so that diffusion of the solder into said electrode can be substantially avoided while said protective inorganic material layer, and said solder, have sufficient adhesion to the electrode.

4. A circuit substrate according to claim 3, wherein a layer of chromium is interposed between the electrode and the electrical circuit so as to avoid diffusion of Ni into the electrical circuit.

5. A circuit substrate according to claim 3, wherein said electrode is provided only at locations interposed between the electrical circuit and the solder.

6. A circuit substrte according to claim 3, wherein the electrical circuit is formed of copper.

7. A circuit substrate according to claim 6, wherein a layer of chromium is interposed between the electrode and the electrical circuit so as to avoid diffusion of Ni into the electrical circuit.

8. A circuit substrate according to claim 3, wherein said circuit substrate is for a thermal printing head.

9. A circuit substrate according to claim 3, wherein the protective inorganic material layer is made of $SiO_2$.

10. A circuit substrate according to claim 3, wherein the alloy of Ni and Cu is a layer, interposed between the solder and electrical circuit, having a thickness of 0.3 to 0.5 $\mu$m.

* * * * *